(12) United States Patent
Hayashi et al.

(10) Patent No.: US 7,982,537 B2
(45) Date of Patent: Jul. 19, 2011

(54) OPERATIONAL AMPLIFIER

(75) Inventors: Yoshihiro Hayashi, Akishima (JP); Masaki Yoshinaga, Hino (JP); Takashi Matsumoto, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/354,309

(22) Filed: Jan. 15, 2009

(65) Prior Publication Data

US 2009/0184767 A1 Jul. 23, 2009

(30) Foreign Application Priority Data

Jan. 21, 2008 (JP) .................................. 2008-009991

(51) Int. Cl.
*H03F 3/45* (2006.01)
(52) U.S. Cl. ...................................... 330/253
(58) Field of Classification Search .............. 330/253, 330/255; 327/333
See application file for complete search history.

(56) References Cited

U.S. PATENT DOCUMENTS

| | | | |
|---|---|---|---|
| 4,180,780 A * | 12/1979 | Rumbaugh | 330/252 |
| 6,100,762 A | 8/2000 | Kato | |
| 6,262,633 B1 * | 7/2001 | Close | 330/267 |
| 2004/0061556 A1 | 4/2004 | Miura | |
| 2005/0225389 A1 * | 10/2005 | Koyasu | 330/252 |
| 2007/0273441 A1 | 11/2007 | Watanabe | |

FOREIGN PATENT DOCUMENTS

| | | |
|---|---|---|
| JP | 11-088076 A | 3/1999 |
| JP | 11-136044 A | 5/1999 |
| JP | 2000-349570 A | 12/2000 |
| JP | 2004-128815 A | 4/2004 |
| JP | 2006-157607 A | 6/2006 |

* cited by examiner

*Primary Examiner* — Robert Pascal
*Assistant Examiner* — Khiem D Nguyen
(74) *Attorney, Agent, or Firm* — Miles & Stockbridge P.C.

(57) ABSTRACT

Disclosed herewith is a circuit system for improving a slew rate while reducing the power consumption in an operational amplifier that requires a comparatively high supply voltage (e.g., 5 V or upper) operation. The operational amplifier includes level shift circuits, differential pairs whose source connected serially, current voltage conversion circuit and output stage. The level shift circuits convert a differential input signal level and output to differential pairs. Combination of level shift circuit and differential pairs realize input signal difference detection and driving current control in the common circuit.

20 Claims, 5 Drawing Sheets

OPERATIONAL AMPLIFIER

CLAIM OF PRIORITY

The present application claims priority from Japanese patent application JP 2008-009991 filed on Jan. 21, 2008, the content of which is hereby incorporated by reference into this application.

FIELD OF THE INVENTION

The present invention relates to an operational amplifier, more particularly to an operational amplifier that realizes high driving ability with a high supply voltage.

BACKGROUND OF THE INVENTION

Conventionally, there have been operational amplifiers, in each of which a detection circuit is connected to a current source in parallel and the current source supply is increased only when there is an input level difference detected at the detection circuit. (For such operational amplifiers, refer to JP-A-Hei 11-1360441, JP-A-2004-128815, and JP-A-Hei 11-88076.)

Furthermore, there have also been other type operational amplifiers, in each of which the current source increases the current supply when there is an input level difference in a voltage follower, that is, when there is a level difference between an input and an output (refer to JP-A-2006-157607 and JP-A-2000-349570).

SUMMARY OF THE INVENTION

An operational amplifier is used in various application fields. One of such application fields is a buffer circuit used for driving a large capacitive load. In this case, it is required to integrate many operational amplifiers having high driving capabilities in one IC. And in order to improve the driving capabilities of those operational amplifiers, it is just required to increase their driving currents respectively. In this case, however, the increase of the power consumption comes up as a problem.

As a means for realizing both of a high slew rate and reduction of such power consumption, there has been conceived a circuit that can detect an input potential difference between operational amplifiers in case where the supply voltage is low (e.g., 5V or under) and in case where there is an input potential difference between those operational amplifiers, a driving current control circuit is used to increase the driving current flow in each of those operational amplifiers. While there is no input signal difference detected, the driving current flow is kept low. The driving current flow is increased only when an input signal difference is detected, thereby realizing a high slew rate in the active state while reducing the power consumption in the idle state. Such control methods have been proposed conventionally for the use of the operational amplifiers as described above when they are driven with a low supply voltage (e.g., 5V or under) respectively. And one of such methods is disclosed in JP-A-Hei 11-1360441, JP-A-2004-128815, and JP-A-Hei 11-88076 in which a detection circuit is connected to a current source supply in parallel and only when there is an input level difference, the current source supply is increased. Another is disclosed in JP-A-2006-157607 and JP-A-2000-349570, in which if an input difference is detected by a voltage follower, that is, if a level difference between the input and the output exceeds a predetermined value, the current source supply is increased.

In case of any of those methods, in addition to a signal amplification circuit, a detection circuit and a control circuit are required additionally. However, because those detection and control circuits are provided in parallel to the signal amplification circuit and the output driving circuit, the power consumption is made in those added circuits. In spite of this, the power consumption in those added circuits does not affect other items in the object operational amplifier so much when the supply voltage is comparatively low. Thus the effect has been high satisfactorily.

As described above, if the supply voltage is low, for example, if it is 5V or under, the power consumption in the subject operational amplifier can be reduced with any of conventional methods that use an input level difference (input level) detection circuit and a control circuit. If the supply voltage is high, for example, if it is 5V or over, however, the power consumption in each of the added circuits provided in parallel to the amplifier increase proportionally to the supply voltage, so the idle state power consumption in added circuits limits the number of amplifiers integrated in one IC because of heat generated by idle current. This has also been a problem and the present inventor et al. have found such conventional problems by themselves. Furthermore, the present inventor et al have come to find newly that the reduction of the steady power consumption in the input level difference detection circuit and the control circuit in idle state is required to solve the above conventional problems when the supply voltage is high.

On the other hand, each of JP-A-Hei 11-1360441, JP-A-2004-128815, JP-A-Hei 11-88076, JP-A-2006-157607, and JP-A-2000-349570 premises employment of a low voltage circuit configuration. And accordingly, none of the documents 1 to 5 describes anything about the above conventional problems that must be solved to further reduce the power consumption in the driving current control circuit. And none of those documents 1 to 5 describes anything about means for solving those conventional problems.

Under such circumstances, it is an object of the present invention to solve the above described conventional problems and to provide an operational amplifier that requires a comparatively high supply voltage (e.g., 5V or over) for its operation and employs a circuitry system that can improve the slew rate while reducing the power consumption during the idle state.

In a typical example of the present invention, the operational amplifier is configured to include a level shift circuit and a differential amplifier. The level shift circuit converts the level of a differential input signal and outputs the converted differential signal and the differential amplifier has an input connected to a differential output of the level shift circuit. The level shift circuit and the differential amplifier are combined to commonly detect a level difference of the differential input signal and control the driving ability of an output stage of the differential amplifier according to the detected level difference.

More concretely, the operational amplifier of the present invention is configured to include first and second level shift circuits for converting the potential of an input signal to output two potentials; a differential transistor pair circuit having a first differential transistor pair having sources connected to each other and used to input a higher DC potential output of the two outputs from the first and second level shift circuits and a second differential transistor pair having sources connected to each other and used to input the other lower DC potential from the first and second level shift circuits, the sources of the first and second differential transistor pairs being connected to each other electrically; first and second current voltage conversion circuits having connection to the drains of the first and second differential transistor pairs respectively; and an output stage connected electrically to the outputs of the first and second current voltage conversion circuits and controlled by those first and second current voltage conversion circuits.

According to the present invention, therefore, it is possible to improve the slew rate while reducing the power consumption during idle state in each operational amplifier used when the supply voltage is comparatively high (e.g., 5V or over).

DETAILED DESCRIPTION OF THE PREFERRED EMBODIMENTS

According to one aspect of the operational amplifier of the present invention, a level shift circuit and an differential amplifier are connected to each other to detect the difference of an input signal and control the output stage driving ability commonly. In case of each of the configurations disclosed in JP-A-Hei 11-136044, JP-A-2004-128815, JP-A-Hei 11-88076, JP-A-2006-157607, and JP-A-2000-349570, an input level detection circuit is provided separately from an input stage amplifier and connected to the object in parallel to the amplifier. In case of the present invention, however, the input level detection circuit can be omitted, so the power consumption can be prevented from the increase of the power consumption except for that of added level shift circuits. The present invention can thus reduce the total power consumption in all those operational amplifiers. The reason why both the input level detection and the input signal amplification can be made commonly is a surplus of the DC voltage existing in each high voltage circuit. In case of each of the configurations disclosed in JP-A-Hei 11-136044, JP-A-2004-128815, JP-A-Hei 11-88076, JP-A-2006-157607, and JP-A-2000-349570, no input level detection circuit can be connected serially to an input stage amplification circuit. However, the present invention, which intends to apply such an amplifier to a high voltage circuit, can realize such a serial connection.

Next, there will be described a preferred embodiment of the present invention with reference to the accompanying drawings.

First Embodiment

Figure 1:
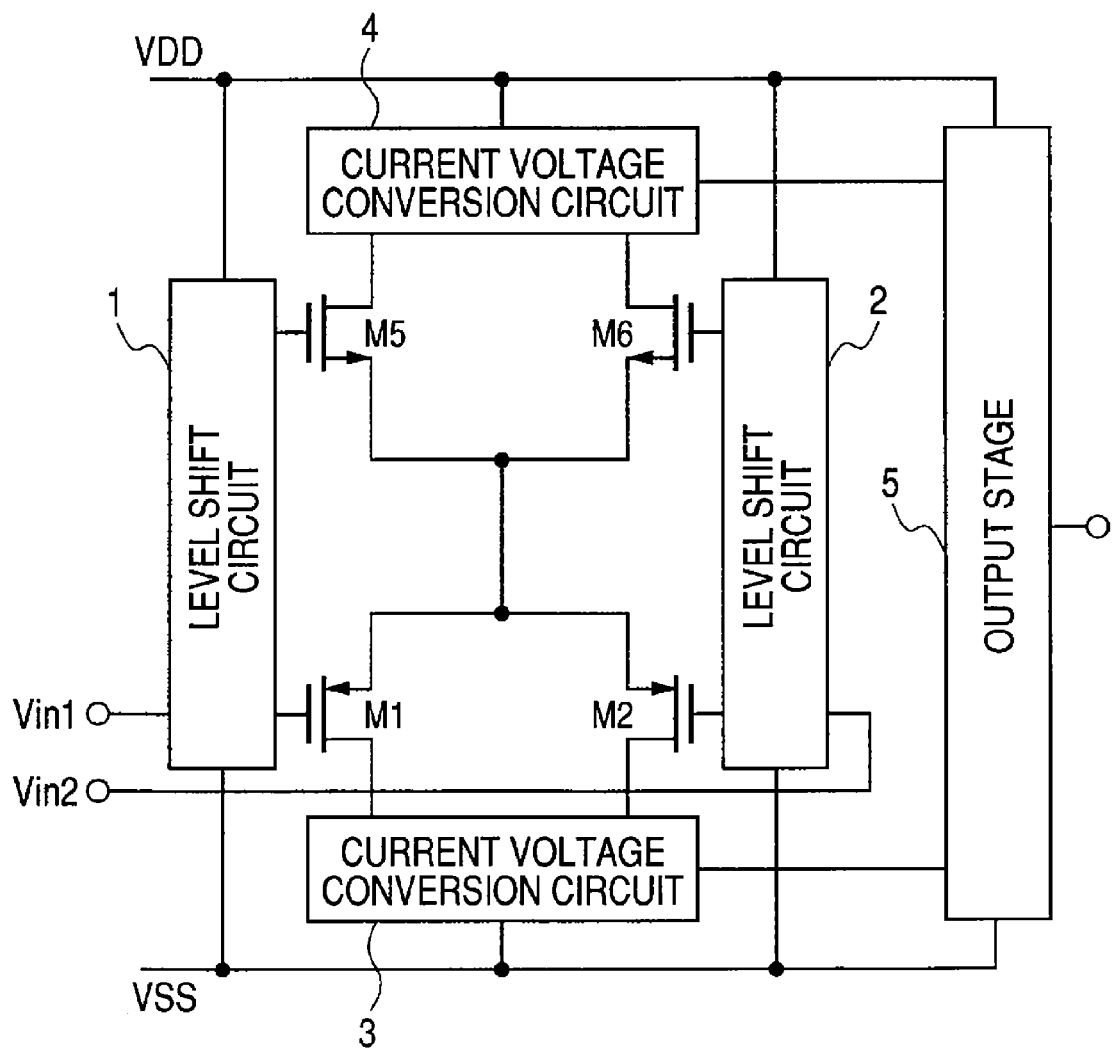
FIG. 1 is a block diagram for describing the basic principle of an operational amplifier of the present invention.

FIG. 1 is a block diagram of an operational amplifier for describing the basic principle of the present invention. Input signals Vin1 and Vin2 are inputted to level shift circuits 1 and 2 respectively. Each of the level shift circuits 1 and 2 has two outputs to output two converted signals to a PMOS differential pair and an NMOS differential pair respectively. The PMOS transistors M1 and M2 are paired to form a differential transistor pair while the NMOS transistors MS and M6 are paired to form a differential transistor pair. The drains of the PMOS transistors M1 and M2 are connected to a current voltage conversion circuit 3 and the drains of the NMOS transistors MS and M6 are connected to a current voltage conversion circuit 4. Each of the current voltage conversion circuits 3 and 4 converts an output current of a differential transistor pair to a voltage used for driving an output stage 5.

In case of a general operational amplifier, a differential transistor pair is biased by a constant-state current source. Consequently, in order to control the current consumption of such a transistor differential pair, it has been required to control the constant-state current source. On the other hand, the present invention that employs level shift circuits 1 and 2 enables serial connection between the differential transistor pairs formed by the M1 and M2, as well as by the MS and M6. And this configuration makes it possible to control the voltage between the gate and the source of each of the two differential transistor pairs according to the difference between the output voltages from the two levelshift circuits at Vin1=Vin2. And at Vin1=Vin2, the current consumption of the differential transistor pairs is determined by the voltage between the gate and the source of each of those two differential transistor pairs, that is, the difference between the output voltages from the two levelshift circuits. Consequently, the current consumption during a idle state operation can be reduced by setting the difference between the output voltages from the two level shift circuits under the sum of the threshold voltages of the P-type and N-type MOS transistors paired to form the two differential transistor pairs respectively. Furthermore, if an input signal difference is detected, in case of Vin1<Vin2, the voltage between the gate and the source of the M1 and M6 goes over the threshold voltage and in case of Vin1>Vin2, the voltage between the gate and the source of the M2 and M5 goes over the threshold voltage. The input signal difference appears in proportion to the voltage between the gate and the source of the M1 and M6 or the voltage between the gate and the source of M2 and M5 respectively. This is why the driving current can be controlled proportionally to the input signal difference.

Next, there will be described the operation of the circuit (operational amplifier) in two cases. In one case, the circuit is in the idle state in which no input signal difference is detected. In the other case, an input signal difference is detected in the circuit.

At first, there will be described the first case in which no input signal difference is detected, that is, Vin1 is equal to Vin2. The input signals Vin1 and Vin2 are inputted to the level shift circuits 1 and 2 respectively. Each of the level shift circuits 1 and 2 adds a certain voltage to each input voltage, and then outputs the result to the PMOS differential pair consisting of M5 and M6 and to the NMOS differential pair consisting of M1 and M2, respectively. At this time, the output voltage difference of the level shift circuits to the PMOS differential pair and the NMOS differential pair should preferably be set around the sum of the threshold voltages of the PMOS and NMOS differential pairs. A current flowing to the differential pairs is determined by the difference between the output voltages of the two level shift circuits and by the characteristics of the PMOS and NMOS of the differential pairs. The current setting as described above makes it possible to control the driving current so as to reduce the idle state current as long as no input signal difference is detected.

Next, there will be described the other case in which an input signal difference is detected in the circuit. In case of Vin1>Vin2, each of the level shift circuits 1 and 2 adds a certain voltage to each input signal, and then outputs the result (two potentials) to the object. So, the M1 gate potential comes to be higher than the M2 gate potential by (Vin1−Vin2) and the M5 gate potential comes to become higher than the M6 gate potential by (Vin1−Vin2). Assume now that the output potential difference between the level shift circuits is set equally to the sum of the threshold voltages of the PMOS and NMOS of the two differential transistor pairs while no input signal difference is detected. Then, the voltage to be applied between the M6 and M1 gates goes lower than the sum of the threshold voltages of the PMOS and NMOS by (Vin1−Vin2). Consequently, M1 and M6 are turned off. On the other hand, the voltage to be applied between the M5 and M2 gates comes to become higher than the sum of the threshold voltages of the PMOS and NMOS by (Vin1−Vin2). Consequently, the M2 and M5 are turned on, thereby the driving current flows. The driving current is then converted to a voltage by the current voltage conversion circuits 3 and 4 respectively and used to control the output stage. In case of Vin1<Vin2, the voltage to be applied between the M5 and M2 gates goes lower than the sum of the threshold voltages of the PMOS and NMOS by (Vin1−Vin2) just like in the above case. Consequently, the M2 and M5 are turned off. On the other hand, the voltage to be applied between the M6 and M1 gates comes to become higher than the sum of the threshold voltages of the PMOS and NMOS by (Vin1−Vin2). Consequently, the M1 and M2 are turned on, thereby the driving current flows. The driving current is then converted to a voltage by the current voltage conversion circuits 1 and 2 respectively and used to control the output stage.

Second Embodiment

Figure 2:
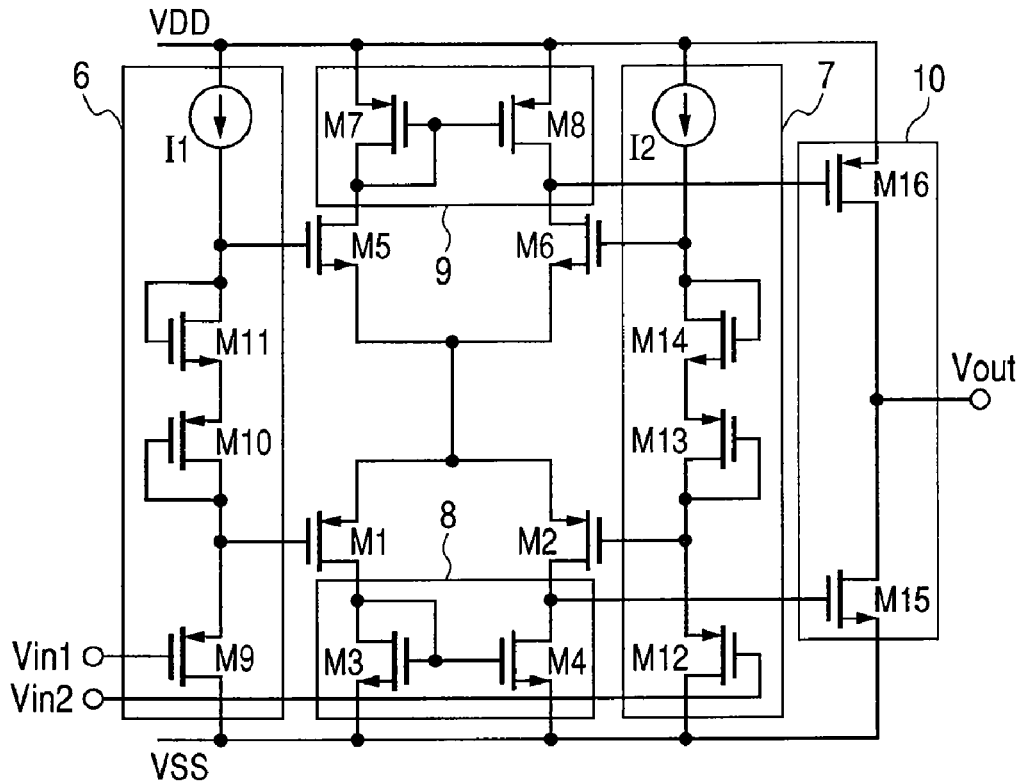
FIG. 2 is a circuit diagram of the operational amplifier in an embodiment of the present invention.

FIG. 2 shows a circuit diagram of an operational amplifier in this second embodiment of the present invention. PMOS transistors M1 and M2 make a differential transistor pair and NMOS transistors M5 and M6 make another differential transistor pair. The drains of those differential transistor pairs are connected to an active load 8 consisting of NMOS transistors M3 and M4 and another active load 9 consisting of NMOS transistors M7 and M8 respectively. The transistors M9, M10, and M11, as well as a current source I1 are combined to form a level shift circuit 6 while the transistors M12, M13, and M14, as well as a current source I2 are combined to form another level shift circuit 7. The M9 and M12 gates input signals Vin1 and Vin2 respectively and the NMOS transistor M15 and the PMOS transistor M16 are combined to form an output stage 10. And the M15 and M16 compose common source stage respectively to realize a high driving current and a wide output voltage range. Because the sources of the M15 and M16 form a common source stage in such a way, the M15 and M16 are turned off to block the current flowing when the load is capacitive and the circuit (operational amplifier) is in the idle state. Consequently, the current consumption in the output stage can be eliminated in the idle state. And because outputs to M15 and M16 can be taken out directly from current voltage conversion circuits connected serially with differential pairs, the present invention doesn't require any additional circuits and realizes low power consumption. Although the output voltage difference between level shift circuits is determined by MOS transistors and a constant-state current source in this embodiment, the MOS transistors and the current source may be replaced with resistors and bipolar transistors, since it is just required to generate a potential difference here. And because the resistance value of each resistor can be determined freely, such a configuration could set an output voltage of each level shift circuit more accurately than the MOS transistors. This is an advantage of this circuit configuration. The positional relationship between a bias current source and an input transistor can also be changed freely. Furthermore, in the above output stage, the source of the MOS transistor is grounded. The output stage can also take another configuration. For example, the MOS transistors can be replaced with bipolar transistors. In this case, the driving ability increases. The current voltage conversion circuit that is an active load type one in this embodiment may employ another load type one such as a resistance load type one.

Next, there will be described the operation of the circuit (operational amplifier) shown in FIG. 2 in two cases. In one case, the circuit is in the idle state in which no input signal difference is detected. In the other case, an input signal difference is detected in the circuit.

At first, a description will be made for the first case in which no input signal difference is detected, that is, Vin1 is equal to Vin2. Input signals Vin1 and Vin2 are inputted to the gates of the level shift circuits 6 (M9) and 8 (M12) respectively. The Vin1 inputted to the M9 is output to the gate of the M1 of the differential transistor pair as a potential, which is obtained by adding the gate-source voltage determined by the constant-state current source I1 and M9 to the Vin1. And a voltage determined by the diode-connected transistor M10 and M11 is added the potential, then the result is output to the M5. The circuit elements are provided symmetrically and the potential is equal between the gates of the M1 and M2 and between the gates of the M5 and M6 respectively. At this time, the idle state current flowing to the differential transistor pairs is determined by the difference between the output potentials of the two level shift circuits and by the transistors of the two differential transistor pairs.

In this embodiment, the same size ratio is set between the level shift circuits M1 and M10, as well as between the level shift circuits M5 and M11 so as to enable each of those level shift circuits to control the idle state current consumption similarly. And because the same size ratio is set between those level shift circuits in such a way, the gate-source voltage of each transistor of each differential transistor pair is determined, thereby a current determined by the size ratio and the I1 comes to flow as a idle state current. Assume now that the relationship between the level shift transistor size and the MOS size of the differential transistor pairs is m:n. At this time, the idle state current, when no input voltage difference is detected, is represented as n/m*I1. Because the circuit elements are provided symmetrically, the same size ratio is assumed between M2 and M13, as well as between M6 and M14. And because two level shift circuits is configured of an NMOS transistor and a PMOS transistor that are connected to each other serially just like in differential transistor pairs connected serially so as to cancel the fluctuation of transistor parameters depending on processes and temperatures, thereby suppressing the change of the idle state current.

Next, there will be described how the circuit operation will be when an input signal difference is detected. In case of Vin1>Vin2, each of the level shift circuits adds a certain voltage to each input signal, then outputs the result as a potential value. Thus the M1 gate potential becomes higher than the M2 gate potential by Vin1–Vin2 and the M5 gate potential becomes higher than the M6 gate potential by Vin1–Vin2. At this time, it is premised that the output potential difference between the two level shift circuits is set equally to the sum of the threshold voltages of the PMOS and NMOS of the two differential transistor pairs. Then, the voltage to be applied to between the M6 and M1 gates becomes lower than the sum of the threshold voltages of the PMOS and NMOS by Vin1–Vin2. Consequently, the M1 and M6 are turned off. On the other hand, the voltage to be applied between the M5 and M2 gates becomes higher than the sum of the threshold voltages of the PMOS and NMOS by Vin1–Vin2. Consequently, the M2 and M5 are turned on. Thus the driving current comes to flow. The current flowing in the M5 is mirrored by the active load formed by the M7 and M8 to turn off the M16. The current flowing in the M2 turns on the M15.

Third Embodiment

Figure 3:
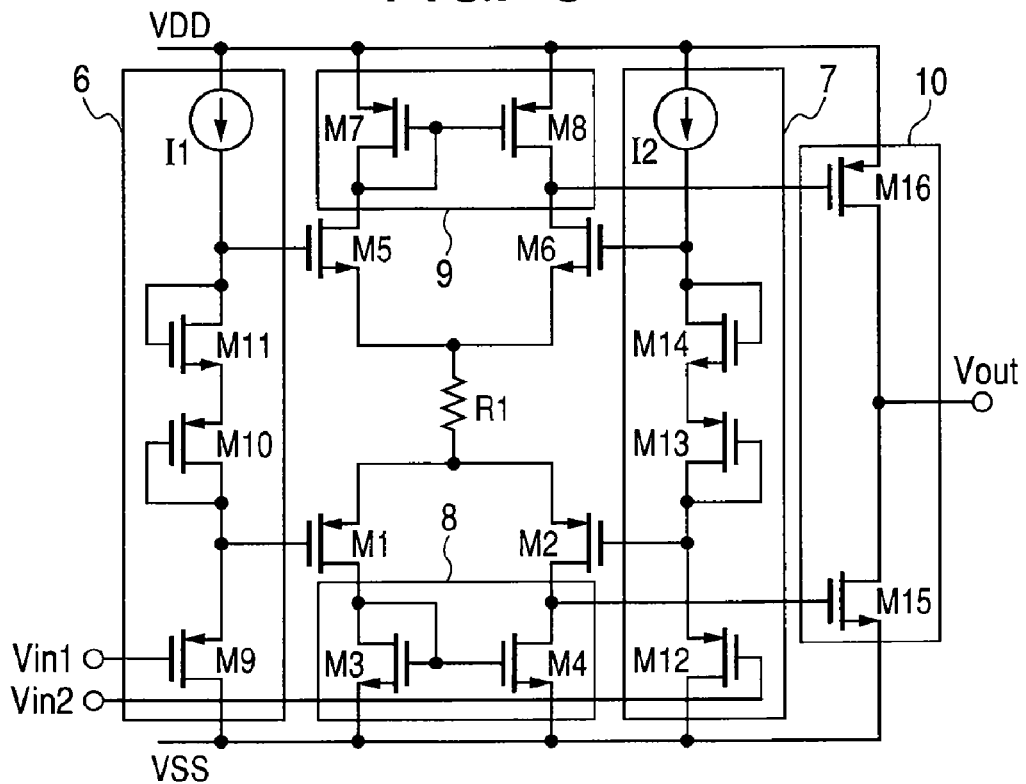
FIG. 3 is a circuit diagram of the operational amplifier having a driving current control circuit added in the embodiment of the present invention.

FIG. 3 shows an operational amplifier in this third embodiment of the present invention. In FIG. 3, a resistor R1 is used as a driving current control circuit. Because the resistor R1 is used in such a way, the current flowing in the subject differential transistor pair causes potential falling, which reduces the gate-source voltage of each transistor of the pair. Thus the current consumption can be reduced. In addition to the level shift circuits and differential transistor pairs, this embodiment can use another parameter that can control the driving current, thereby both the idle state current and the slew rate during operation can be controlled adjustably. If the R1 value increases, both the idle state current flowing in the differential transistor pair and the current flowing during operation can be reduced. While a resistor is used as a driving current control circuit in FIG. 2, the resistor may be replaced with another passive element, a transistor or the like.

Fourth Embodiment

Figure 4:
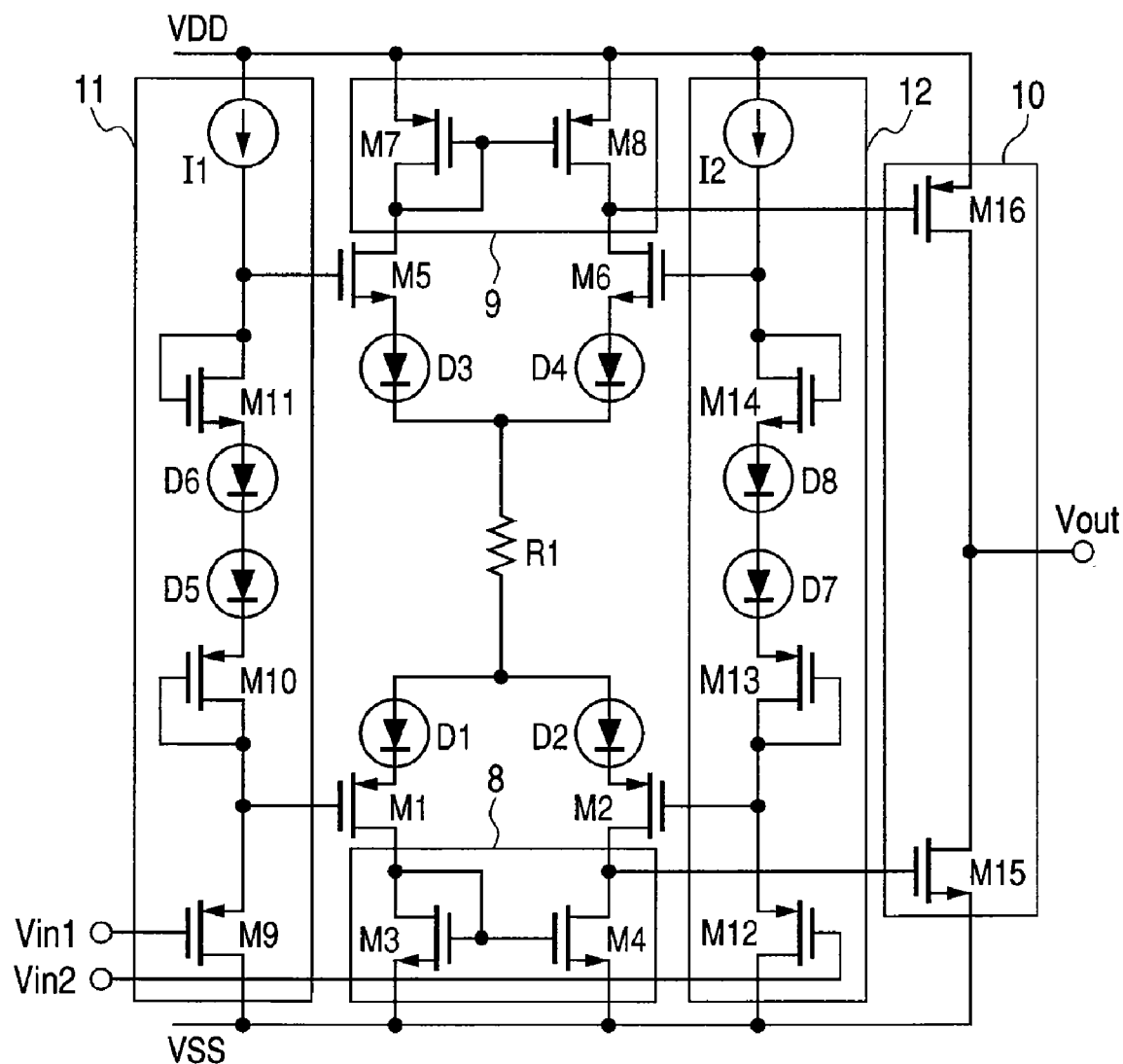
FIG. 4 is a circuit diagram of the operational amplifier having a breakdown voltage preventive circuit added in the embodiment of the present invention.

FIG. 4 shows an operational amplifier in this fourth embodiment of the present invention. If an input voltage amplitude difference is over the gate-source breakdown voltage of each transistor of an object differential pair, the transistor is damaged. The present invention expects that the operational amplifier is to be used when the supply voltage is high comparatively. If the amplifier uses any transistor having a gate-source breakdown voltage lower than the drain-source breakdown voltage, the breakdown voltage might be exceeded. So, in order to avoid this problem, diodes D1 to D8 are added to the amplifier. The diodes D1 to D8 are used as breakdown voltage preventive elements. Now, think about a case of Vin1>Vin2 to understand the functions of the diodes D1 to D8 employed for protecting the amplifier from breakdown voltages. It is premised here that Vin1–Vin2 is double or more of the gate-source breakdown voltage of each of the transistors M1, M2, M5, and M6. At this time, the M2 and M5 are on and the M1 and M6 are off. A current is flowing in both M2 and M5 and a potential drop occurs in the R1. In this case, therefore, a proper R1 can be set to protect the M2 and M5 from overvoltage. On the other hand, Vin1–Vin2 is applied as is between the gates of the M1 and M6 that are off. This is why the breakdown voltage preventive diodes D1 to D4 are disposed in the sources of the differential pairs while the PMOS and NMOS differential pairs are connected to each other through those diodes D1 to D4. As a result, no gate-source voltage is applied between the M1 and M6 that are off and most of the Vin1–Vin2 is applied to both D1 and D6. Thus the M1 and M6 come to be prevented from damages. The breakdown voltage preventive diodes D5 to D8 of the level shift circuits correspond to the diodes D1 to D4. Those diodes come to function to change the characteristics of the differential pairs and the level shift circuits in the same way to cope with temperature fluctuations. Those diodes are not provided for preventing breakdown voltages. Therefore, the breakdown voltage preventive diodes may be omitted from the level shift circuits. The breakdown voltage preventive elements described above may be replaced with MOS transistors if they can resist expected overvoltage.

Fifth Embodiment

Figure 5:
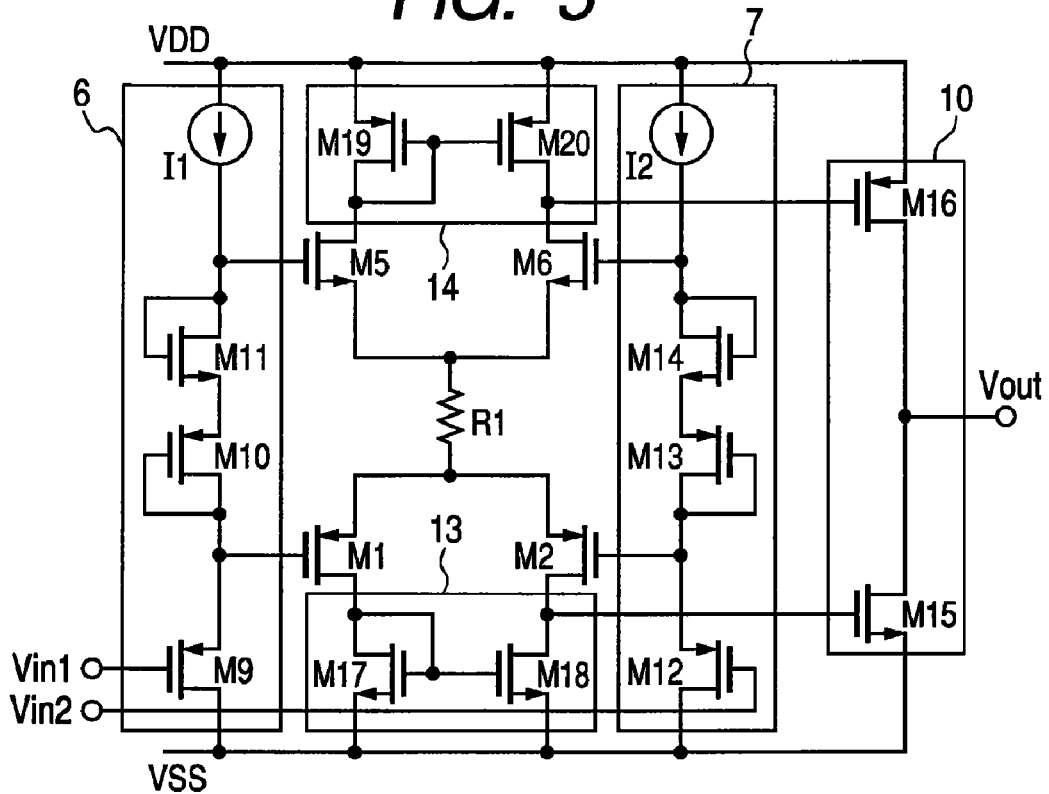
FIG. 5 is a circuit diagram of the operational amplifier having a driving stage power saving circuit added in the embodiment of the present invention.

FIG. 5 shows an operational amplifier in this fifth embodiment of the present invention. When the operational amplifier drives a large load, the MOS transistor of the output stage comes to be larger in size than other transistors of the operational amplifier. Therefore, if a voltage over the threshold voltage Vth is inputted between the gate and the source of the MOS transistor of the output stage while no input voltage difference is detected, a current comes to flow into the output stage in accordance with the size of the MOS transistor. This causes a current consumption problem. And in order to avoid this problem, the NMOS transistors M17 and M18 in the current voltage conversion circuit 13 are replaced with transistors having a threshold voltage Vth, which is lower than that of the NMOS transistor M15 of the output stage. Similarly, the PMOS transistors M19 and M20 of the current voltage conversion circuit 14 are replaced with transistors having a threshold voltage Vth, which is lower than that of the PMOS transistor M16 of the output stage. In the idle state, in which no input voltage difference is detected, the current consumption of the PMOS and NMOS in the output stage is determined by the voltage output from the current voltage conversion circuit that is in the idle state, that is, by the gate-source voltage of the MOS transistor in the output stage. This is why the Vth of the MOS transistor of the current voltage conversion circuit is set lower than the Vth of the MOS transistor of the output stage, thereby the output voltage from the current voltage conversion circuit in the idle state can be set lower than the Vth of the MOS transistor in the output stage and the MOS transistor in the output stage can be turned off. The Vth in the output stage may also be set higher in contrast with that in this fifth embodiment.

Sixth Embodiment

Figure 6:
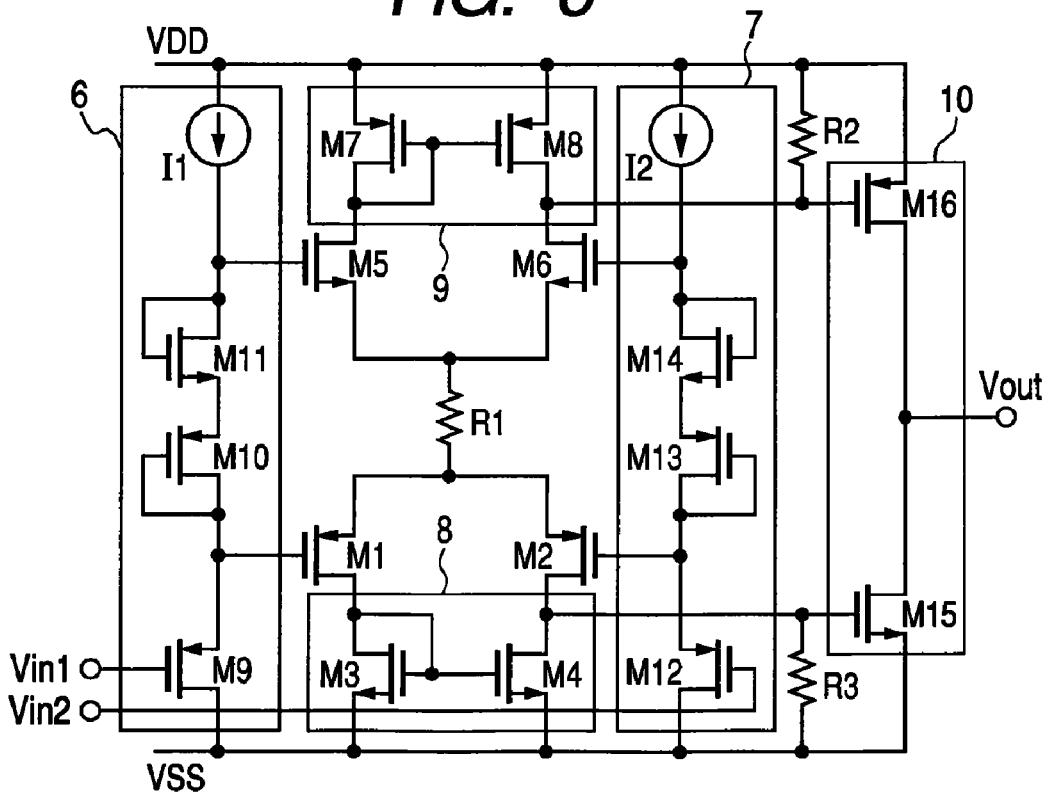
FIG. 6 is a circuit diagram of the operational amplifier having a resistor for controlling the driving current added in the embodiment of the present invention.

FIG. 6 shows an operational amplifier in this sixth embodiment of the present invention. In this embodiment, resistors R2 and R3 are connected to the outputs of the current voltage conversion circuits 8 and 9 respectively. With this addition of the resistors R2 and R3, as described in the embodiment shown in FIG. 5, the output voltage of each of the current voltage conversion circuits 8 and 9 in the idle state can be set under the Vth of the MOS transistor in the output stage to reduce the current consumption in the output stage in the idle state. In this case, the resistance values of the R2 and R3 should be determined by taking consideration to the current flowing in the object differential transistor pair. If an input signal difference is detected, the differential transistor pair flows the driving current. However, if the resistance values of the R2 and R3 are set too small, the driving current comes to flow in those resistors, thereby the gate-source voltage of the transistor in the output stage goes lower, causing a shortage of the driving current. While the resistor R1 is used as a driving current limiting circuit in this embodiment, it may be omitted.

Seventh Embodiment

Figure 7:
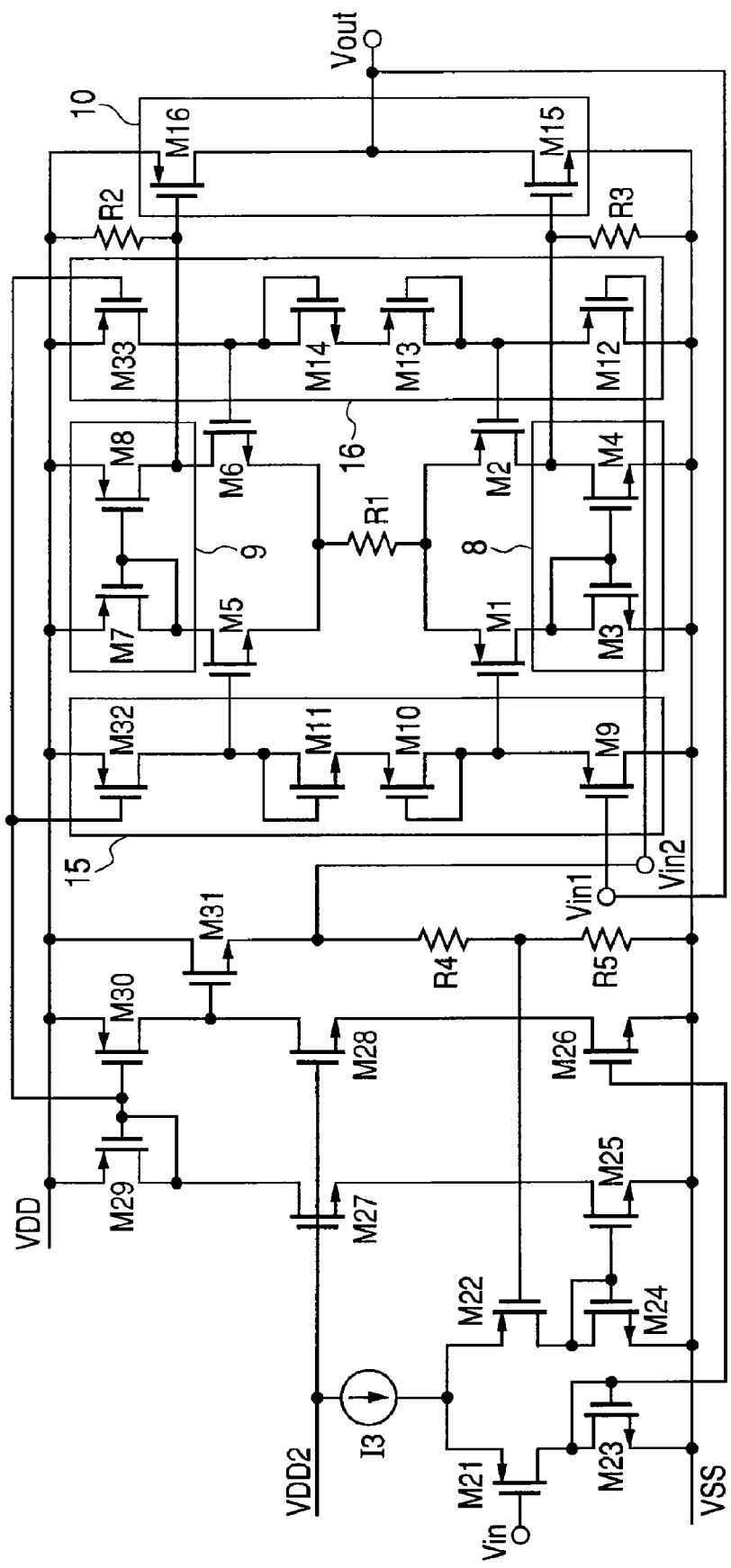
FIG. 7 is a circuit diagram of the operational amplifier having a level shift circuit power saving circuit added in the embodiment of the present invention.

FIG. 7 shows an operational amplifier in this seventh embodiment. The circuit shown in FIG. 7 multiplies the voltage inputted from the Vin node by (r4+r5)/r5 when the resistance values of the resistors R4 and R5 are assumed as r4 and r5. The multiplier then outputs the result through a buffer that includes a voltage follower that is the operational amplifier of the present invention. This circuit uses, the information about the preceding stage of the operational amplifier to control the bias current, thereby reducing the power consumption of each level shift circuit. The configuration of the amplification circuit in the preceding stage of the operational amplifier of the present invention is not limited only to that in this embodiment.

Next, there will be described the operation of the circuit shown in FIG. 7. The signal whose level is between the power supplies VDD2 and VSS is inputted to Vin node and converted to a current by the differential transistor pair consisting of the M21 and M22, which is biased by the constant-state current source I3. The converted current is copied by the current mirror pairs consisting of the M23 and M26 and consisting of the M24 and M25 respectively. The current copied by the M25 is returned again by the current mirrors M29 and M30 connected to the power supply VDD of which voltage is higher than the VDD2, through a common gate circuit M27. This current is then compared with the current copied by the M26 and the voltage of the drain of M30 inputted to the M31 consisting the source follower. The voltage divided by the resistors R4 and R5 is returned so as to become equal to the input voltage to Vin, so the output potential of the source follower is multiplied by (r4+r5)/r5. This multiplied voltage is inputted to the operational amplifier of the present invention employed as a voltage. The level shift circuits 15 and 16 of the operational amplifier use current mirrors formed with the M29 and M30 to generate a bias current. When the inputs Vin1 and Vin2 of the operational amplifier increase, the bias current flowing from the M32 and M33 is required to increase, since otherwise the output speed of each of the level shift circuit slows down. On the other hand, when Vin1 and Vin2 decrease, the bias current may be small. This is because the M9 and M12 determine the operation speeds of the level shift circuits respectively. While the output of level shift circuits are constant in the idle state, so they do not require so much bias current. In such a way, it is only when the input voltage to the operational amplifier increases that the bias current determines the operation speed of each level shift circuit. The current flowing in the M29 in the preceding stage increases when the input voltage to the operational amplifier increases and decreases when the input voltage to the operational amplifier decreases or it is kept as is. Thus the power consumption of the operational amplifier can be reduced in the idle state just by generating the current for each level shift circuit with use of the M29.

As described above, in each of the embodiments of the present invention, an input signal difference detection circuit and a driving current control circuit are connected to each other serially with use of level shift circuits, although those circuits are connected to each other in parallel conventionally. As a result, as long as the input voltage is kept on the same level, the power consumption can be reduced by reducing the current consumption in the operational amplifier and when an input voltage difference is detected, the current consumption of the operational amplifier is increased so as to improve the slew-rate.

Furthermore, the MOS transistors used in each of the embodiments of the present invention may be replaced with bipolar transistors. Variations in those embodiments of the present invention are also effective even when they are combined freely. Each level shift circuit is given a bias current from its upstream power supply. The bias current may also be given from a downstream electrode. This is also true for inputs. Although inputs are made from the downstream power supply side, they may be made from the upstream electrode side.

What is claimed is:
1. An operational amplifier, comprising:
a pair of level shift circuits that convert levels of a pair of differential input signals and output the level converted differential signals; and
a pair of differential amplifiers each having a pair of inputs each connected to a differential output of one of the level shift circuits; and
an output stage having a pair of inputs each connected to a corresponding output of the pair of differential amplifiers,
wherein the level shift circuits and the differential amplifiers cooperate to detect a level difference between the pair of differential input signals and to control a driving ability with respect to the output stage in accordance with the detected level difference,
wherein the pair of level shift circuits include
a first level shift circuit which has an input connected to one differential input signal, and which outputs a first potential voltage by adding a voltage to said differential input signal and a second potential voltage higher than the first potential voltage,
a second level shift circuit which has an input connected to another differential input signal, and which outputs a third potential voltage by adding a voltage to said another differential input signal and a fourth potential voltage higher than the third potential voltage,
wherein the differential amplifier includes
a first conductivity type transistor differential pair which have respective inputs connected to an output of the second potential voltage and to an output of the fourth potential voltage and having first ends connected to each other at a first connection,
a second conductivity type transistor differential pair which have respective inputs connected to an output of the first potential voltage and to an output of the third potential voltage and having first ends connected to each other at a second connection,
a first current voltage conversion circuit connected to a second end of each of the first conductivity type transistor differential pair,
a second current voltage conversion circuit connected to a second end of each of the second conductivity type transistor differential pair, and
a driving current control circuit which causes a voltage drop by a current flowing in the first conductivity type transistor differential pair and in the second conductivity type transistor differential pair,
wherein the first current voltage conversion circuit is connected to a first power supply,
wherein the second current voltage conversion circuit is connected to a second power supply having a lower potential than the first power supply, and wherein the first connection and the second connection are connected in series with the first power supply and the second power supply through the driving current control circuit.

2. The operational amplifier according to claim 1, wherein the driving current control circuit includes a resistance element.

3. The operational amplifier according to claim 1, wherein the first current voltage conversion circuit comprises a first active load including a first transistor pair, wherein one of two drains of the first transistor pair is connected to a first common gate and the other drain is used as a first output, wherein the two drains of the first transistor pair are respectively connected to the drains of the first conductivity type transistor differential pair, wherein the second current voltage conversion circuit comprises a second active load including a second transistor pair, wherein one of two drains of the second transistor pair is connected to a second common gate and the other drain is used as a second output, and wherein the two drains of the second transistor pair are respectively connected to the drains of the second conductivity type transistor differential pair.

4. The operational amplifier according to claim 1, wherein the first conductivity type transistor differential pair is an n-type MOS transistor differential pair having gates connected to the output of the second potential voltage and to the output of the fourth potential voltage and having sources connected at the first connection to each other, wherein the second conductivity type transistor differential pair is a p-type MOS transistor differential pair having gates connected to the output of the first potential voltage and to the output of the third potential voltage and having sources connected at the second connection to each other, wherein drains of each of the n-type MOS transistor differential pair are connected to the first current voltage conversion circuit, wherein drains of each of the p-type MOS transistor differential pair are connected to the second current voltage conversion circuit, and wherein the driving current control circuit reduces gate-source voltages of the n-type MOS transistor differential pair and the p-type MOS transistor differential pair.

5. The operational amplifier according to claim 1, further comprising:
a first pair of breakdown voltage preventive elements connected serially to the first ends of the first conductivity type transistor differential pair with the first connection; and
a second pair of breakdown voltage preventive elements connected serially to the first ends of the second conductivity type transistor differential pair with the second connection.

6. The operational amplifier according to claim 5, wherein each of the first and second breakdown voltage preventive element pairs includes a diode.

7. The operational amplifier according to claim 5, wherein each of the first and second breakdown voltage preventive elements includes a MOS transistor.

8. The operational amplifier according to claim 1, further comprising:
a first resistance element disposed between the output of the first current voltage conversion circuit and the first power supply; and
a second resistance element disposed between the output of the second current voltage conversion circuit and the second power supply,
wherein the output voltage of the first current voltage conversion circuit in an idle state in which no input voltage difference is detected is set to a first predetermined voltage by the first resistance element,
wherein the output voltage of the second current voltage conversion circuit in the idle state is set to a second predetermined voltage by the second resistance element,
wherein the first predetermined voltage is a threshold voltage of a first transistor in the output stage, and
wherein the second predetermined voltage is a threshold voltage of a second transistor in the output stage.

9. The operational amplifier according to claim 1, wherein the level shift circuit includes a p-type MOS transistor having drain and gate connected, and an n-type MOS transistor having drain and gate connected between a current source connected to the first power supply and a MOS transistor having a drain connected to the second power supply, and
wherein the output stage includes a p-type MOS transistor which comprises a common source stage and has an input connected to the output of the first current voltage conversion circuit, and an n-type MOS transistor which comprises a common source stage and which has an input connected to the output of the second current voltage conversion circuit.

10. The operational amplifier according to claim 1, wherein p-type MOS transistors of the first current voltage conversion circuit are transistors having a threshold voltage which is lower than that of the p-type MOS transistor of the output stage, and
wherein n-type MOS transistors of the second current voltage conversion circuit are transistors having a threshold voltage which is lower than that of the n-type MOS transistor of the output stage.

11. An operational amplifier, comprising:
a first level shift circuit that converts a level of an input signal and outputs a first potential and a second potential higher than the first potential;
a second level shift circuit that converts a level of an input signal and outputs a third potential and a fourth potential higher than the third potential;
an n-type MOS transistor differential pair each having a gate input connected to the output of second potential and the fourth potential and each having sources connected at a first connection to each other;
a p-type MOS transistor differential pair each having a gate input connected to the output of first potential and the third potential and each having sources connected at a second connection to each other;
a first current voltage conversion circuit connected to a drain of each of the n-type MOS transistor differential pair;
a second current voltage conversion circuit connected to a drain of each of the p-type MOS transistor differential pair;
an output stage electrically connected to the first and second current voltage conversion circuits and controlled by the first and second current voltage conversion circuits; and a driving current control circuit which controls gate-source voltages of the n-type MOS transistor differential pair and the p-type MOS transistor differential pair, wherein the first current voltage conversion circuit is connected to a first power supply, wherein the second current voltage conversion circuit is connected to a second power supply lower in potential than the first power supply, and wherein the first connection and the second connection are connected in series with the first power supply and the second power supply through the driving current control circuit.

12. The operational amplifier according to claim 11, wherein the driving current control circuit causes a decrease in a potential by a current flowing in the n-type MOS transistor differential pair and the p-type MOS transistor differential pair.

13. The operational amplifier according to claim 11, wherein the driving current control circuit includes a resistance element.

14. The operational amplifier according to claim 11, further comprising:
a first pair of breakdown voltage preventive elements connected serially to the source of each of the n-type MOS transistor differential pair with the first connection; and
a second pair of breakdown voltage preventive elements connected serially to the source of each of the p-type MOS transistor differential pair with the second connection.

15. The operational amplifier according to claim 14, wherein each of the first and second breakdown voltage preventive element pairs includes a diode.

16. The operational amplifier according to claim 14, wherein each of the first and second breakdown voltage preventive elements includes a MOS transistor.

17. The operational amplifier according to claim 11, further comprising:
a first resistance element disposed between the output of the first current voltage conversion circuit and the first power supply; and
a second resistance element disposed between the output of the second current voltage conversion circuit and the second power supply,
wherein the output voltage of the first current voltage conversion circuit in an idle state in which no input voltage difference is detected is set to a first predetermined voltage by the first resistance element,
wherein the output voltage of the second current voltage conversion circuit in the idle state is set to a second predetermined voltage by the second resistance element,
wherein the first predetermined voltage is a threshold voltage of a first transistor in the output stage, and
wherein the second predetermined voltage is a threshold voltage of a second transistor in the output stage.

18. The operational amplifier according to claim 11, wherein each of the first and second level shift circuits includes a p-type MOS transistor having drain and gate connected, and an n-type MOS transistor having drain and gate connected between a current source connected to the first power supply and a MOS transistor having a drain connected to the second power supply, and
wherein the output stage includes a p-type MOS transistor which comprises a common source stage and has an input connected to the output of the first current voltage conversion circuit, and an n-type MOS transistor which comprises a common source stage and which has an input connected to the output of the second current voltage conversion circuit.

19. The operational amplifier according to claim 11, wherein the first current voltage conversion circuit comprises a first active load including a first transistor pair,
wherein one of two drains of the first transistor pair is connected to a first common gate and the other drain is used as a first output,
wherein the two drains of the first transistor pair are respectively connected to the drains of the n-type MOS transistor differential pair,
wherein the second current voltage conversion circuit comprises a second active load including a second transistor pair,
wherein one of two drains of the second transistor pair is connected to a second common gate and the other drain is used as a second output, and
wherein the two drains of the second transistor pair are respectively connected to the drains of the p-type MOS transistor differential pair.

20. The operational amplifier according to claim 11, wherein p-type MOS transistors of the first current voltage conversion circuit are transistors having a threshold voltage which is lower than that of the p-type MOS transistor of the output stage, and
wherein n-type MOS transistors of the second current voltage conversion circuit are transistors having a threshold voltage which is lower than that of the n-type MOS transistor of the output stage.

* * * * *